(12) United States Patent
Dersch et al.

(10) Patent No.: US 9,072,200 B2
(45) Date of Patent: Jun. 30, 2015

(54) HOT AISLE CONTAINMENT PANEL SYSTEM AND METHOD

(75) Inventors: Joseph M. Dersch, Maryland Heights, MO (US); Jonathan M. Lomas, Blythewood, SC (US); John H. Bean, Jr., Wentzville, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 372 days.

(21) Appl. No.: 12/207,727

(22) Filed: Sep. 10, 2008

(65) Prior Publication Data

US 2010/0061057 A1 Mar. 11, 2010

(51) Int. Cl.
*H05K 7/20* (2006.01)
*H05K 5/00* (2006.01)
*A47H 1/00* (2006.01)

(52) U.S. Cl.
CPC ....... *H05K 7/20745* (2013.01); *Y10T 29/49002* (2015.01)

(58) Field of Classification Search
CPC ............. E06B 9/08; E06B 9/11; E06B 9/115; E06B 9/40; E06B 9/54; G06F 1/20; G06F 1/181; G06F 1/184; G06F 1/182; H01L 23/46; H05K 7/20745; H05K 7/20
USPC .............. 160/127, 130, 133, 229.1, 241, 181, 160/218, 231.2, 244, 274, 266, 25, 371, 41, 160/42, 43, 89; 361/690, 724, 679.48, 361/679.49, 679.5, 679.51, 691, 695; 52/63; 62/259
See application file for complete search history.

(56) References Cited

U.S. PATENT DOCUMENTS 1,680,092 A * 8/1928 Dixson ........................... 160/31
2,060,582 A * 11/1936 Leffert .......................... 160/120
3,545,224 A 12/1970 Nicoski et al.
3,791,089 A 2/1974 Alderman
4,063,431 A 12/1977 Dankowski
4,083,245 A 4/1978 Osborn (Continued)

FOREIGN PATENT DOCUMENTS

CN 1521591 A 8/2004
CN 2763404 Y 3/2006

(Continued)

OTHER PUBLICATIONS

Modern Plastics, accessed Aug. 22, 2104 from http://www.modernplastics.com/-c-103.html.*

(Continued)

*Primary Examiner* — Katherine Mitchell
*Assistant Examiner* — Jeremy Ramsey
(74) *Attorney, Agent, or Firm* — Lando & Anastasi LLP

(57) ABSTRACT

An air containment system includes a plurality of panel assemblies configured to be arranged in side-to-side relation to form a ceiling. In one embodiment, each panel assembly includes a flexible panel having a first end, a second opposite end, a first side and a second opposite side, a first end connector configured to secure the first end of the flexible panel to one of a rack and a wall, and a second end connector configured to secure the second end of the flexible panel to one of a rack and a wall. Other embodiments of the air containment system and related methods are further disclosed.

4 Claims, 8 Drawing Sheets

(56) References Cited

U.S. PATENT DOCUMENTS

| | | | |
|---|---|---|---|
| 4,138,857 A | 2/1979 | Dankowski | |
| 5,028,087 A * | 7/1991 | Ells | 296/24.41 |
| 5,259,206 A | 11/1993 | Dankowski | |
| 5,279,360 A | 1/1994 | Hughes et al. | |
| 5,341,870 A | 8/1994 | Hughes et al. | |
| 5,533,259 A | 7/1996 | Hughes et al. | |
| 5,879,232 A | 3/1999 | Luter, II et al. | |
| 5,924,300 A | 7/1999 | Fromm et al. | |
| 6,034,873 A | 3/2000 | St.ang.hl et al. | |
| 6,199,337 B1 | 3/2001 | Colson et al. | |
| 6,315,525 B1 | 11/2001 | Webb | |
| 6,343,011 B1 | 1/2002 | Yu | |
| 6,668,565 B1 | 12/2003 | Johnson et al. | |
| 6,672,955 B2 * | 1/2004 | Charron | 454/184 |
| 6,732,789 B2 | 5/2004 | Jang | |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |
| 7,046,514 B2 * | 5/2006 | Fink et al. | 361/695 |
| 7,140,193 B2 | 11/2006 | Johnson et al. | |
| 7,145,772 B2 | 12/2006 | Fink | |
| 7,165,412 B1 | 1/2007 | Bean, Jr. | |
| 7,173,820 B2 | 2/2007 | Fink et al. | |
| 7,259,963 B2 | 8/2007 | Germagian et al. | |
| 7,278,273 B1 | 10/2007 | Whitted et al. | |
| 7,293,666 B2 | 11/2007 | Mattlin et al. | |
| 7,297,022 B2 | 11/2007 | Pearce | |
| 7,325,410 B1 | 2/2008 | Bean, Jr. | |
| 7,372,695 B2 | 5/2008 | Coglitore et al. | |
| 7,403,391 B2 | 7/2008 | Germagian et al. | |
| 7,430,118 B1 | 9/2008 | Noteboom et al. | |
| 7,508,663 B2 | 3/2009 | Coglitore | |
| 7,508,666 B1 | 3/2009 | Henneberg et al. | |
| 7,511,960 B2 | 3/2009 | Hillis et al. | |
| 7,551,971 B2 | 6/2009 | Hillis | |
| 7,611,327 B2 | 11/2009 | Holston et al. | |
| 7,643,285 B2 | 1/2010 | Nishiyama et al. | |
| 7,646,590 B1 | 1/2010 | Corhodzic et al. | |
| 7,672,128 B2 | 3/2010 | Noteboom et al. | |
| 7,688,578 B2 | 3/2010 | Mann et al. | |
| 7,724,518 B1 | 5/2010 | Carlson et al. | |
| 7,800,900 B1 | 9/2010 | Noteboom et al. | |
| 7,856,838 B2 | 12/2010 | Hillis et al. | |
| 7,916,470 B2 | 3/2011 | Mills et al. | |
| 7,944,692 B2 | 5/2011 | Grantham et al. | |
| 7,957,142 B2 | 6/2011 | Noteboom et al. | |
| 7,990,710 B2 | 8/2011 | Hellriegel et al. | |
| 8,031,468 B2 | 10/2011 | Bean, Jr. et al. | |
| 8,174,829 B1 | 5/2012 | Rotheroe | |
| 8,184,435 B2 | 5/2012 | Bean, Jr. et al. | |
| 8,251,785 B2 | 8/2012 | Schmitt et al. | |
| 8,305,757 B2 | 11/2012 | Keisling et al. | |
| 8,360,833 B2 | 1/2013 | Grantham | |
| 8,395,891 B2 | 3/2013 | Noteboom et al. | |
| 8,405,982 B2 | 3/2013 | Grantham et al. | |
| 8,611,087 B2 | 12/2013 | Sato et al. | |
| 8,628,154 B2 | 1/2014 | Caveney et al. | |
| 8,628,158 B2 | 1/2014 | Caveney | |
| 8,755,182 B2 | 6/2014 | Noteboom et al. | |
| 2003/0050003 A1 | 3/2003 | Charron | |
| 2004/0184232 A1 | 9/2004 | Fink | |
| 2005/0011637 A1 | 1/2005 | Takano | |
| 2005/0209740 A1 | 9/2005 | Vann | |
| 2005/0280986 A1 | 12/2005 | Coglitore et al. | |
| 2006/0108105 A1 | 5/2006 | Huang et al. | |
| 2006/0260338 A1 * | 11/2006 | VanGilder et al. | 62/259.2 |
| 2006/0283111 A1 * | 12/2006 | Ayers et al. | 52/239 |
| 2007/0084589 A1 | 4/2007 | Nishino et al. | |
| 2007/0146994 A1 * | 6/2007 | Germagian et al. | 361/695 |
| 2007/0167125 A1 | 7/2007 | Rasmussen et al. | |
| 2007/0262606 A1 * | 11/2007 | Schnoblen et al. | 296/143 |
| 2008/0043426 A1 | 2/2008 | Nishiyama et al. | |
| 2008/0055850 A1 | 3/2008 | Carlson et al. | |
| 2008/0060372 A1 | 3/2008 | Hillis et al. | |
| 2008/0123288 A1 | 5/2008 | Hillis | |
| 2008/0141525 A1 | 6/2008 | Breiding et al. | |
| 2008/0160902 A1 | 7/2008 | Desler | |
| 2008/0185446 A1 | 8/2008 | Tozer | |
| 2008/0291626 A1 * | 11/2008 | Nelson et al. | 361/696 |
| 2009/0014397 A1 | 1/2009 | Moss et al. | |
| 2009/0025418 A1 | 1/2009 | De La Cruz et al. | |
| 2009/0046427 A1 | 2/2009 | Noteboom et al. | |
| 2009/0046429 A1 | 2/2009 | Werner et al. | |
| 2009/0080173 A1 | 3/2009 | Porter et al. | |
| 2009/0086428 A1 | 4/2009 | Campbell et al. | |
| 2009/0168345 A1 * | 7/2009 | Martini | 361/691 |
| 2009/0241578 A1 | 10/2009 | Carlson et al. | |
| 2009/0251860 A1 | 10/2009 | Belady et al. | |
| 2009/0255653 A1 | 10/2009 | Mills et al. | |
| 2009/0319650 A1 | 12/2009 | Collins et al. | |
| 2010/0111698 A1 | 5/2010 | Wiedeman et al. | |
| 2010/0144265 A1 | 6/2010 | Bednarcik et al. | |
| 2010/0188816 A1 | 7/2010 | Bean, Jr. et al. | |
| 2010/0190430 A1 | 7/2010 | Rodriguez et al. | |
| 2010/0230058 A1 * | 9/2010 | Mahoney | 160/331 |
| 2010/0263830 A1 | 10/2010 | Noteboom et al. | |
| 2010/0300648 A1 | 12/2010 | Grantham | |
| 2010/0307716 A1 | 12/2010 | Bean, Jr. et al. | |
| 2010/0315775 A1 | 12/2010 | Grantham et al. | |
| 2010/0329885 A1 | 12/2010 | Criner et al. | |
| 2011/0108207 A1 | 5/2011 | Mainers et al. | |
| 2011/0299242 A1 | 12/2011 | Grantham et al. | |
| 2012/0012283 A1 | 1/2012 | Bean, Jr. et al. | |
| 2012/0300391 A1 | 11/2012 | Keisling et al. | |
| 2013/0300266 A1 | 11/2013 | Ramey et al. | |

FOREIGN PATENT DOCUMENTS

| | | |
|---|---|---|
| CN | 1880779 A | 12/2006 |
| CN | 101438637 A | 5/2009 |
| DE | 20014274 U1 | 11/2000 |
| DE | 20 2004 003309 U1 | 8/2004 |
| DE | 202008010718 U1 | 2/2009 |
| EP | 0 033 182 A2 | 8/1981 |
| EP | 1 069 381 A1 | 1/2001 |
| EP | 1448040 A2 | 8/2004 |
| FR | 2949641 A1 | 3/2011 |
| JP | 2003-166729 A | 6/2003 |
| JP | 2005260148 A | 9/2005 |
| JP | 2007316989 A | 12/2007 |
| JP | 2009097774 A | 5/2009 |
| JP | 2010122747 A | 6/2010 |
| SE | 456449 B | 10/1988 |
| WO | 9963797 A1 | 12/1999 |
| WO | 2007090804 A2 | 8/2007 |

OTHER PUBLICATIONS

American Power Conversion Corporation Brochure, "Hot Aisle Containment System (HACS)," 2008, pp. 1-68.

International Search Report for PCT/US2009/068506 mailed Apr. 8, 2010.

APC's InfraStruXure(R) Hot-Aisle Containment Systems a Key to Sun's New Energy Efficient Data Center, Press release of American Power Conversion Corporation, West Kingston, R.I., Oct. 16, 2007.

International Search Report for PCT/US2010/035092 dated Aug. 31, 2010.

International Search Report for PCT/US2009/068506 dated Apr. 8, 2010.

"Inter-Rack Flow Seperator to Prevent Computer Rack Hot Exhaust Air Entry into Cold Region at Rack Inlet of Computer Data Center Facilities" IP.com Journal, IP.com Inc., West Henrietta, NY, US, Jun. 20, 2006, XP013114636 ISSN: 1533-0001.

Invitation to Pay Additional Fees and Partial International Search Report for PCT/US2009/053759 mailed Nov. 16, 2009.

International Search Report for PCT/US2009/053759 mailed Apr. 9, 2010.

International Search Report for PCT/US2010/035212 mailed Feb. 8, 2011.

International Search Report for PCT/US2010/035418 mailed Aug. 17, 2010.

(56) References Cited

OTHER PUBLICATIONS

Invitation to Pay Additional Fees and Partial International Search Report for PCT/US2010/035212 mailed Oct. 5, 2010.
Rotheroe et al., "Hot Aisle Based Heat Removal Unit", RD545030, Hewlett-Packard Co., Sep. 2009.
Stahl et al., "Designing an Alternative to Conventional Room Cooling", Interlec 2001, Oct. 2001, pp. 109-115.
Extend European Search Report from corresponding Application No. 13183500.1 dated Nov. 8, 2013.
Chinese Search Report from corresponding Chinese Application No. 200980135495.6 issued on Jul. 11, 2014.

* cited by examiner

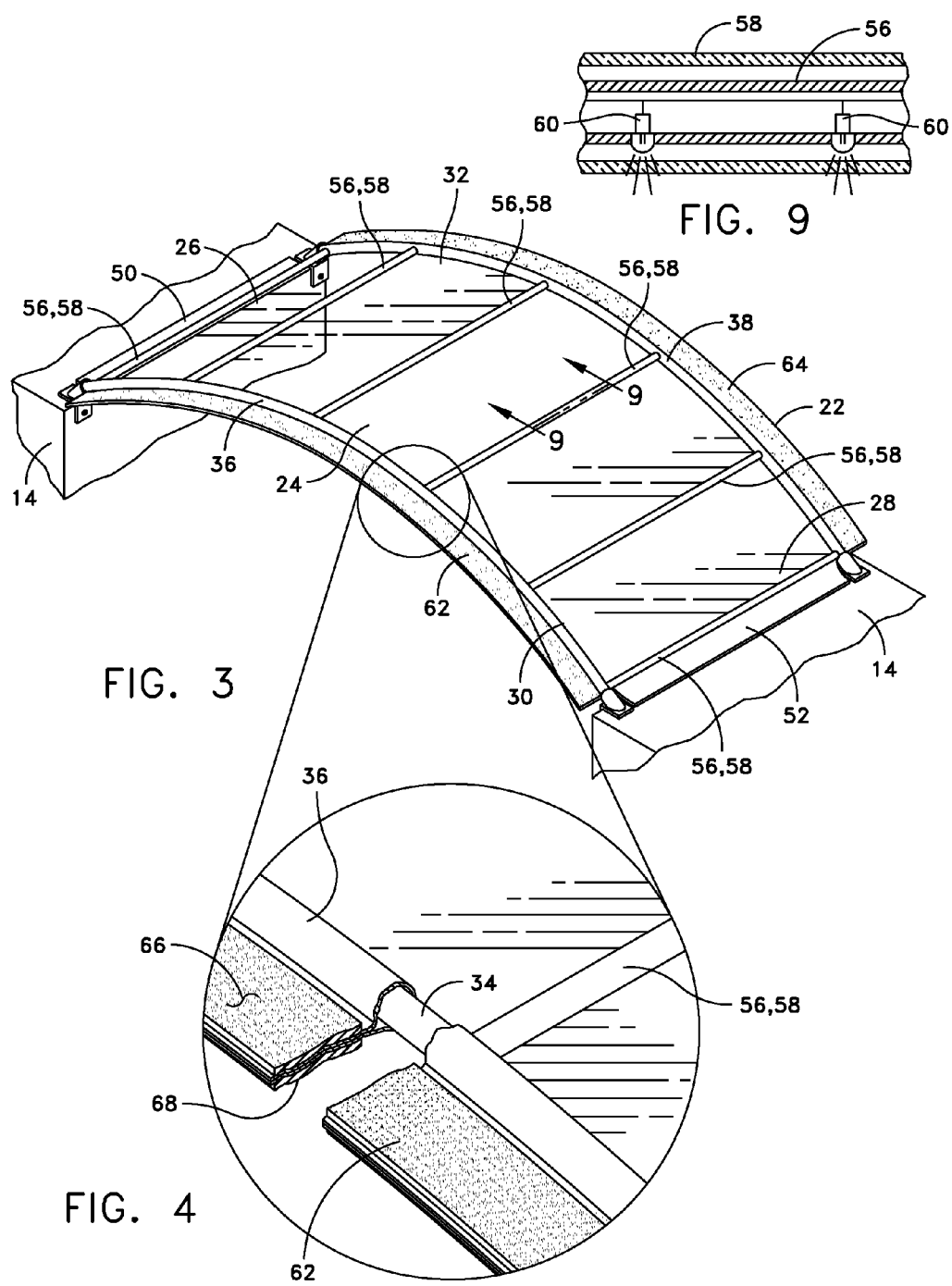

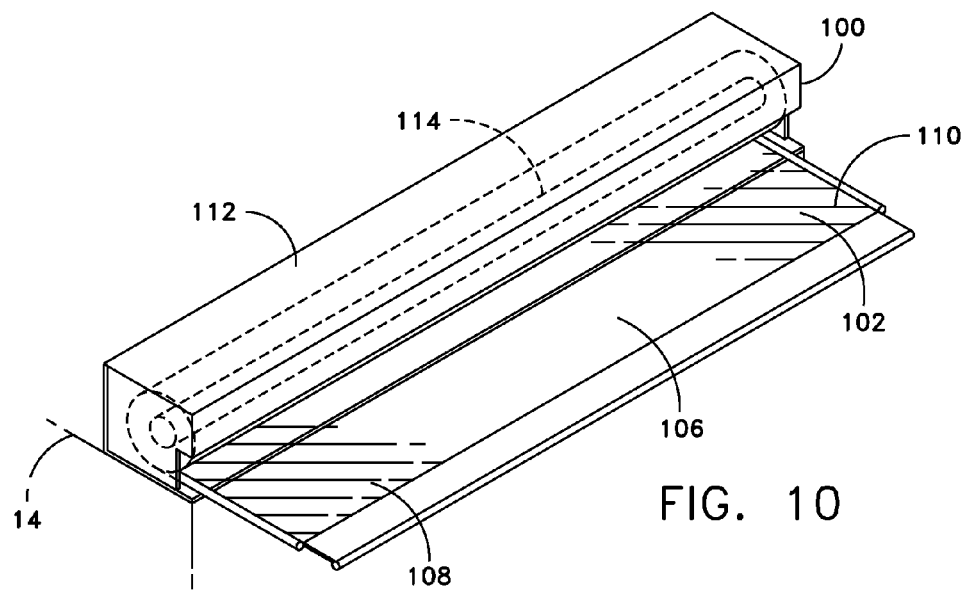
FIG. 10
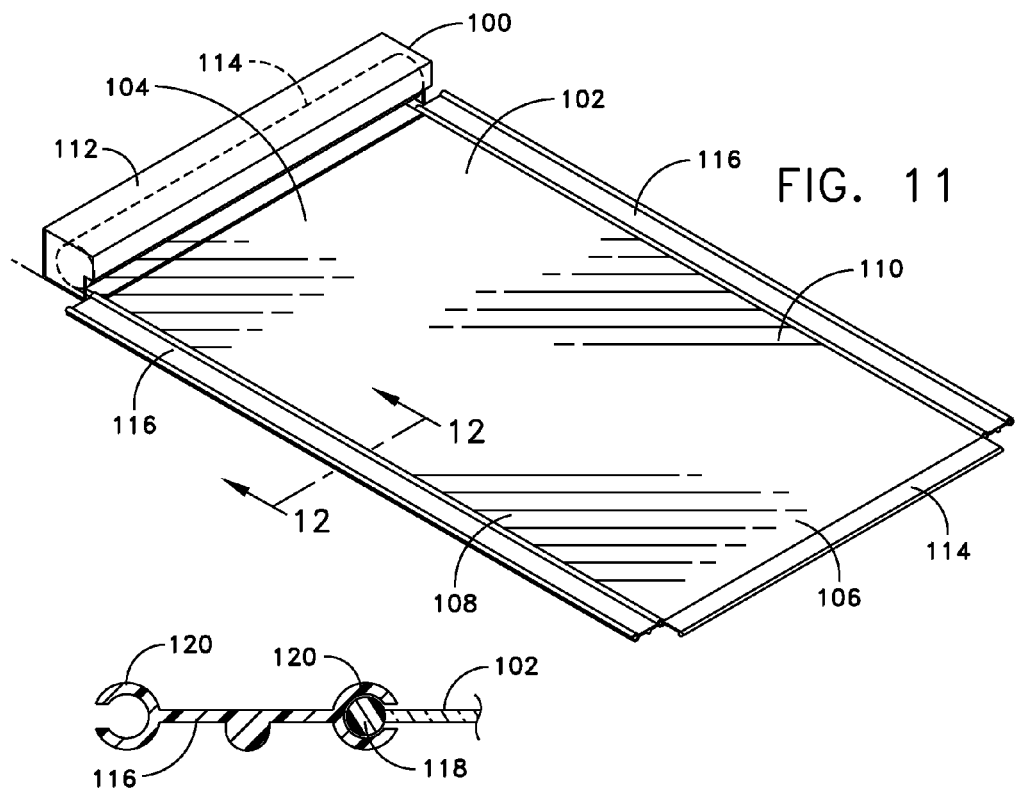
FIG. 11
FIG. 12

HOT AISLE CONTAINMENT PANEL SYSTEM AND METHOD

BACKGROUND OF THE INVENTION

1. Field of the Invention

The present disclosure relates to racks and enclosures, and more particularly to equipment used to cool racks and enclosures of the type used to house data processing, networking and telecommunications equipment.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by supplementing a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

In order to control the flow of air throughout the data center, and to optimize the air flow as described above, it may be desirable to contain the air within the hot and cold aisles, and in particular, the hot aisle. However, for existing data centers, it may be difficult to retrofit the equipment and cooling units with "standard" containment systems that require significant customization. Also, while previous systems and methods of air containment, particularly hot air containment, have proven effective in controlling airflow management in the data center, such systems are expensive and difficult to install, even when installing the system along with the equipment and cooling racks. Examples of such a hot aisle air containment system may be found in U.S. Pat. Nos. 6,859,366 and 7,046,514. Other examples of hot aisle containment systems are provided by American Power Conversion Corporation of West Kingston, R.I., the assignee of the present disclosure, under model nos. ACDC1014, ACDC1015, ACDC1018 and ACDC1019.

SUMMARY OF THE INVENTION

One aspect of the disclosure is directed to an air containment system comprising a plurality of panel assemblies configured to be arranged in side-to-side relation to form a ceiling. In one embodiment, each panel assembly includes a flexible panel having a first end, a second opposite end, a first side and a second opposite side, a first end connector configured to secure the first end of the flexible panel to one of a rack and a wall, and a second end connector configured to secure the second end of the flexible panel to one of a rack and a wall.

Embodiments of the air containment system may include providing each panel assembly with at least one elongate support member configured to provide support along a length of the flexible panel. The at least one elongate support member may include a shock cord pole configured to be received within a sleeve formed in the flexible panel. The first end connector and the second end connector may each comprise a device, secured to one of the rack and the wall, configured to secure an end of the shock cord pole. Each panel assembly may include a cross support member configured to provide support along a width of the flexible panel. In a certain embodiment, the cross support member has a plurality of light elements. Each panel assembly may further include a first side connector configured to secure the first side of the flexible panel to a side of a flexible panel of an adjacent panel assembly and a second side connector configured to secure the second side of the flexible panel to a side of a flexible panel of an adjacent panel assembly. The first side connector and the second side connector may each comprise one of hook and loop fastener material configured to releasably engage the other of hook and loop fastener material provided on one of the first side and the second side of the adjacent flexible panel. In another embodiment, each panel assembly may comprise a support housing configured to be secured to one of the rack and the wall. The support housing may include a spring-loaded supply roll configured to engage the first end connector of the flexible panel. The arrangement is such that the flexible panel is configured to be removed from the spring-loaded supply roll to extend to one of the rack and the wall. The second end connector may comprise one of hook and loop fastener material configured to releasably engage the other of hook and loop fastener material provided on one of the rack and the wall. The flexible panel may be extended from the support housing to a desired length. The flexible panel may be fabricated from translucent material.

Another aspect of the disclosure is directed to a method of enclosing a hot or cold aisle of data center having a plurality of racks arranged in rows within the data center. In a certain embodiment, the method comprises: providing a flexible panel; securing a first end of the flexible panel to one of a rack and a wall; and securing a second end of the flexible panel to one of a rack and a wall, with the flexible panel extending across the hot or cold aisle.

Embodiments of the method may further include securing at least one side of the flexible panel to a side of an adjacent flexible panel and securing the other side of the flexible panel to a side of an adjacent flexible panel. The method may further include supporting the flexible panel with at least one support member. In a particular embodiment, when securing the first end of the flexible panel, a support housing is secured to one of the rack and the wall. The support housing may comprise a spring-loaded supply roll configured to engage the first end of the flexible panel. The method may further include extending the flexible panel from the spring-loaded supply roll of the support housing to one of the rack and the wall. The method may also include securing at least one elongate support member to the flexible panel to provide support along a length of the flexible panel.

Yet another aspect of the disclosure may be directed to a panel assembly for an air containment system configured to enclose a hot or cold aisle of a data center. In one embodiment, the panel assembly comprises a flexible panel having a first end, a second opposite end, a first side and a second opposite side, a first end connector configured to secure the first end of the flexible panel to one of a rack and a wall, a second end connector configured to secure the second end of the flexible panel to one of a rack and a wall, and at least one elongate support member configured to provide support along a length of the flexible panel. In a certain embodiment, the at least one elongate support member includes a shock cord pole configured to be received within a sleeve formed in the flexible panel.

Embodiments of the panel assembly may include a cross support member configured to provide support along a width of the flexible panel. The cross support member may include a plurality of light elements. The first end connector and the second end connector may each comprise a device, secured to one of the rack and the wall, configured to secure the ends of the shock cord pole. The panel assembly may further comprise at least one side connector configured to secure a side of the flexible panel to a side of a flexible panel of an adjacent panel assembly.

Another aspect of the disclosure is directed to a panel assembly for an air containment system configured to enclose a hot or cold aisle of a data center. In a particular embodiment, the panel assembly comprises a flexible panel having a first end, a second opposite end, a first side and a second opposite side, a support housing configured to be secured to one of the rack and the wall, the support housing comprising a spring-loaded supply roll configured to secure the first end of the flexible panel, and a second end connector configured to secure the second end of the flexible panel to one of a rack and a wall. In one embodiment, the flexible panel may be configured to be removed from the spring-loaded supply roll to extend to one of the rack and the wall.

Embodiments of the panel assembly may include providing the second end connector with one of hook and loop fastener material configured to releasably engage the other of hook and loop fastener material provided on one of the rack and the wall. The panel assembly may further comprise at least one side connector configured to secure a side of the flexible panel to a side of a flexible panel of an adjacent panel assembly.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which:

FIG. 3 is a perspective view of the air containment panel assembly shown in FIG. 2;

FIG. 4 is an enlarged perspective view of a portion of the air containment panel assembly shown in FIG. 3;

FIG. 9 is a cross-sectional view taken along line 9-9 in FIG. 3;

FIG. 10 is a perspective view of an air containment panel assembly of another embodiment of the disclosure with a flexible panel of the assembly in a substantially rolled up, stored position;

FIG. 11 is a perspective view of the air containment panel assembly shown in FIG. 10 with the flexible panel in a substantially extended position;

FIG. 12 is a cross-sectional view taken along line 12-12 in FIG. 11;

DETAILED DESCRIPTION OF THE PREFERRED EMBODIMENTS

Figure 1:
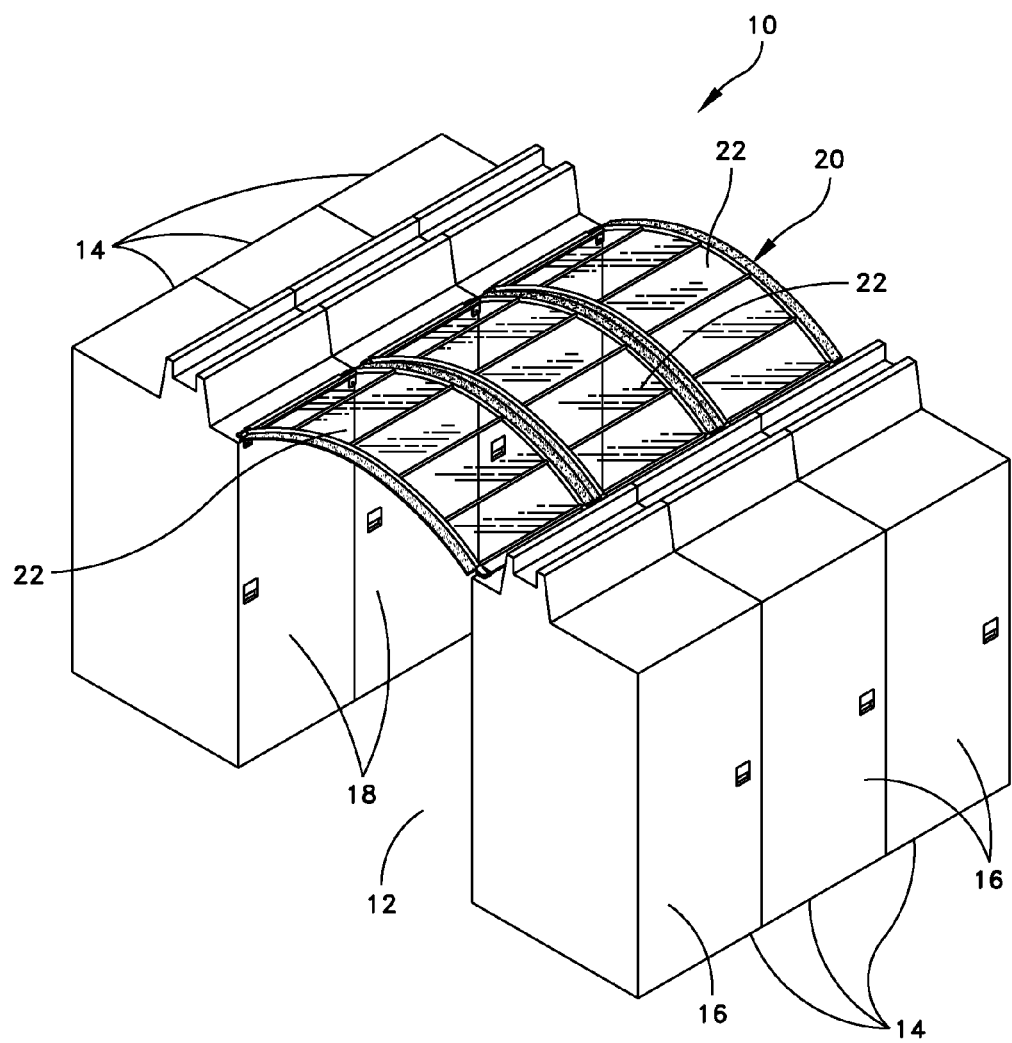
FIG. 1 is a perspective view of an aisle of a data center showing an air containment system of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Further, cabling between the equipment racks may be implemented using cable distribution troughs contained on the roofs of the racks as disclosed in U.S. Pat. No. 6,967,283, which is also incorporated herein by reference and assigned to the assignee of the present disclosure. The principles of the present disclosure may be adapted to smaller data centers, equipment rooms, computer rooms, and even wiring closets. The data center described herein is provided by way of example only.

Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. A lock may be provided to prevent access into the interior of the equipment rack and the equipment housed by the rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Casters may be secured to the bottom of each equipment rack to enable the rack to roll along the floor of the data center. Once positioned, leveling feet may be deployed to securely ground the equipment rack in place within the row.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the traditional CRAC units described above. With yet another configuration, a modular cooling system may be provided.

Such a modular system is described in pending U.S. patent application Ser. No. 11/335,874, entitled COOLING SYSTEM AND METHOD, filed on Jan. 19, 2006, which is owned by the assignee of the present disclosure and is incorporated herein by reference. The cooling system may include a plurality of cooling racks disposed within the data center. In one embodiment, the arrangement may be such that there is a cooling rack for every two equipment racks provided in the data center. However, it should be understood that a person skilled in the art, and given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system and the type of equipment housed within the data center.

Details of the modular cooling system and its various components and configurations may be found in pending U.S. patent application Ser. No. 11/335,874. Also, the cooling system may embody other cooling configurations, such as those offered by American Power Conversion Corporation of West Kingstown, R.I., the assignee of the present disclosure.

In one embodiment, a management system may be provided to monitor and display conditions of a cooling rack or of multiple cooling racks. The management system may operate independently to control the operation of the cooling rack, and may be configured to communicate with a higher level network manager or with a management system associated with the equipment storage racks. For example, in a particular embodiment, a controller may be provided to control the operation of the cooling racks. The controller may be a dedicated unit to the cooling system of the data center. In another embodiment, the controller may be provided as part of an integrated data center control and monitoring system. In yet another embodiment, each cooling rack may be independently operable by a controller provided in the cooling rack that is in communication with controllers of the other cooling racks. Notwithstanding the particular configuration, the controller is designed to control the independent operation of the cooling racks within the data center.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master unit and the other cooling racks operate as subservient units that operate under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

As with the equipment racks, the cooling racks may be modular in construction and configured to be rolled into and out of position, e.g., within a row of the data center between two equipment racks. Casters may be secured to the bottom of the housing of the cooling rack to enable the cooling rack to roll along the floor of the data center. Once positioned, leveling feet may be deployed to securely ground the cooling rack in place within the row. In another embodiment, the housing of the cooling rack may be formed with an eye-bolt to enable a crane or some other lifting apparatus to raise and place the cooling rack within the data center.

In one embodiment, the arrangement is such that the fronts of the equipment and cooling racks are adjacent the cold aisle and the backs of the racks are adjacent the hot aisle. The modular and movable nature of the cooling rack makes it particularly effective in cooling locations within the data center requiring climate control, e.g., adjacent a hot aisle. This configuration enables the cooling rack to be used as a building block for data center cooling and climate control, as the data center operator adds and removes cooling racks on an as needed basis. Thus, the cooling rack allows a far superior level of scalability than prior CRAC units. In addition, an operable cooling rack may be quickly and easily provided to replace a failed cooling rack.

The controller may be adapted to control the operation of the cooling system based on environmental parameters obtained by the controller. In one embodiment, the controller may embody only controller units provided in the cooling racks that communicate with one another over a controller area network (CAN) Bus. In other embodiments, a master controller may be provided to control the operation of the controller units. Each cooling rack may be provided with a display assembly that is operably coupled to the controller. The display assembly is adapted to display the environmental conditions of the data room, such as, and not limited to, the temperature and the humidity of the data center at the cooling rack, the temperature of the air entering into and exiting out of the cooling rack, the temperature of coolant entering into and exiting out of the cooling rack, the flow rate of coolant entering the cooling rack, and the cooling capacity of the cooling rack. Suitable monitors and/or gauges may be provided to acquire such information. Alternatively, or in addition to the foregoing embodiment, the environmental conditions may be displayed on a unit provided with an integrated data center control and monitoring system.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks. Known ceiling assemblies are awkward to lift overhead and install, and require precise spacing between the rows of equipment racks.

Embodiments of an air containment system of the disclosure may include a plurality of panel assemblies configured to be arranged in side-to-side relation to form a ceiling. In one embodiment, each panel assembly may be configured to include a flexible, lightweight panel having a first end, a second opposite end, a first side and a second opposite side. The panel assembly further may be further configured with a first end connector configured to secure the first end of the flexible panel to one of a rack and a wall, a second end connector configured to secure the second end of the flexible panel to one of a rack and a wall, a first side connector configured to secure the first side of the flexible panel to a second side of a flexible panel of an adjacent panel assembly, and a second side connector configured to secure the second side of the flexible panel to a first side of a flexible panel of an adjacent panel assembly. This construction enables multiple panel assemblies to be quickly and easily installed between rows of equipment racks that are either newly constructed or existing, regardless of the lengths of the rows or the width of the aisle.

Referring now to the drawings, and more particularly to FIG. 1, a portion of a data center 10 is illustrated. In particular, a hot aisle 12 within the data center 10 is illustrated. As shown, and by way of example only, a plurality of equipment racks, each indicated at 14, are disposed within the data center 10. Specifically, a first row of equipment racks 14 are positioned so that fronts 16 of the equipment racks face outwardly. Similarly, a second row of equipment racks 14 are positioned so that the fronts of the equipment racks face outwardly and backs 18 of the equipment racks face backs 18 of the first row of equipment racks. The arrangement is such that hot air is exhausted through the backs of the equipment racks into the aisle formed between the first row and the second row. As discussed above, this aisle 12 may sometimes be referred to herein as the "hot" or "warm" aisle. As discussed above, cooling racks (not shown) may be interposed among the equipment racks 14 for cooling the hot aisle 12. However, for illustration purposes only, equipment racks 14 are shown throughout the drawings.

As shown in FIG. 1, air is capable of escaping from the hot aisle 12 above the equipment racks 14. As is well known, warm air rises, thus creating a situation in which the ceiling of the data center 10 may become too warm. This situation may negatively affect the climate control and management within the data center 10. An air containment system, generally indicated at 20, of embodiments of the present disclosure is designed to contain and control the flow of warm air within the data center 10 in general, and within the space between the equipment racks 14 specifically. The air containment system 20 includes multiple panel assemblies, each indicated at 22, which are configured to be arranged in side-to-side relation to form a ceiling as shown in FIG. 1. The particular arrangement and interconnection of the multiple panel assemblies 22 will be described in greater detail as the description of the air containment system 20 proceeds.

Figure 2:
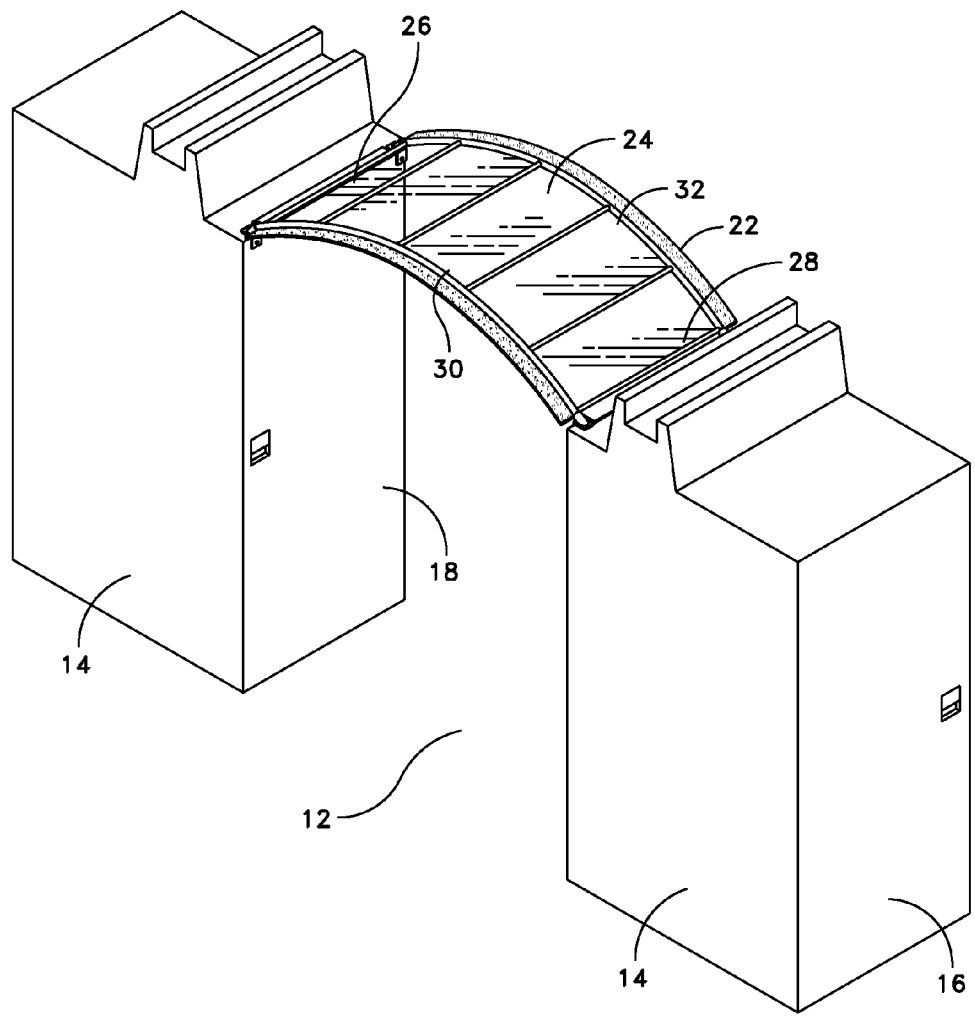
FIG. 2 is a perspective view of a portion of the aisle showing two equipment racks and a single air containment panel assembly.

FIGS. 2-9 illustrate one embodiment of an air containment system 20 incorporating panel assemblies 22 with each panel assembly being configured to connect to adjacently placed panel assemblies for creating the ceiling over the hot aisle 12 that is illustrated in FIG. 1. As shown in FIGS. 2 and 3, the panel assembly 22 has a lightweight, flexible panel 24 that may be fabricated from a suitable translucent material, such as fabric or plastic. The translucent material enables light to pass through the panel 24 for illuminating the aisle 12 when employing the air containment system 20. Opaque or semi-translucent material may be selected; however, the aisle 12 would require additional lighting. The flexible panel 24 may be generally rectangular in shape, having opposite ends 26, 28 and opposite sides 30, 32. The size and shape of the panel 24 of each panel assembly 22 may depend on the distance between the two rows of equipment racks 14 and the width of each equipment rack. In one embodiment, the flexible panel 24 has a widthwise dimension approximately equal to the width of the equipment rack 14 facing the aisle 12. In another embodiment, the flexible panel 24 has a lengthwise dimension that is greater than its widthwise dimension. The flexible panel 24 may be configured to achieve any size or dimension. For example, in one embodiment, the flexible panel 24 may have a widthwise dimension of approximately one-half the widthwise dimension of the equipment rack 14. In another embodiment, the flexible panel 24 may have a widthwise dimension proximate to the widthwise dimensions of two or more equipment racks 14.

As best shown in FIGS. 2 and 3, the flexible panel 24 of the panel assembly 22, in a supported position, is generally arcuate in shape to enable a person to comfortably walk through the aisle 12 when the air containment system 20 is deployed. It should be understood that the panel assembly 22 may be configured to achieve other shapes, such as, but not limited to, triangular, trapezoidal, and elliptical, to name a few.

To provide lengthwise support, the panel assembly includes two shock cord poles, each indicated at 34, which are received in respective sleeves 36, 38 formed in the flexible panel 24. In one configuration, as shown in FIG. 4, a sleeve 36 is formed along the length of the flexible panel along one side 30 of the panel 34. Similarly, another sleeve 38 is formed along the length of the flexible panel 24 along the other, opposite side 32 of the panel. The sleeves 36, 38 may be fabricated from stitching the fabric panel material, or by molding the plastic material, for example. The arrangement is such that the poles 34 are sized to fit within their respective sleeves 36, 38 to provide support along the sides 30, 32 of the flexible panel 24. The length of the shock cord poles 34 may be sized so that the ends of the pole extend just beyond the edges of the sleeves 36, 38. In another configuration, one or more shock cord poles 34 may be provided between the two shock cord poles that are disposed along the sides 30, 32 to support the middle of the flexible panel.

Figure 5:
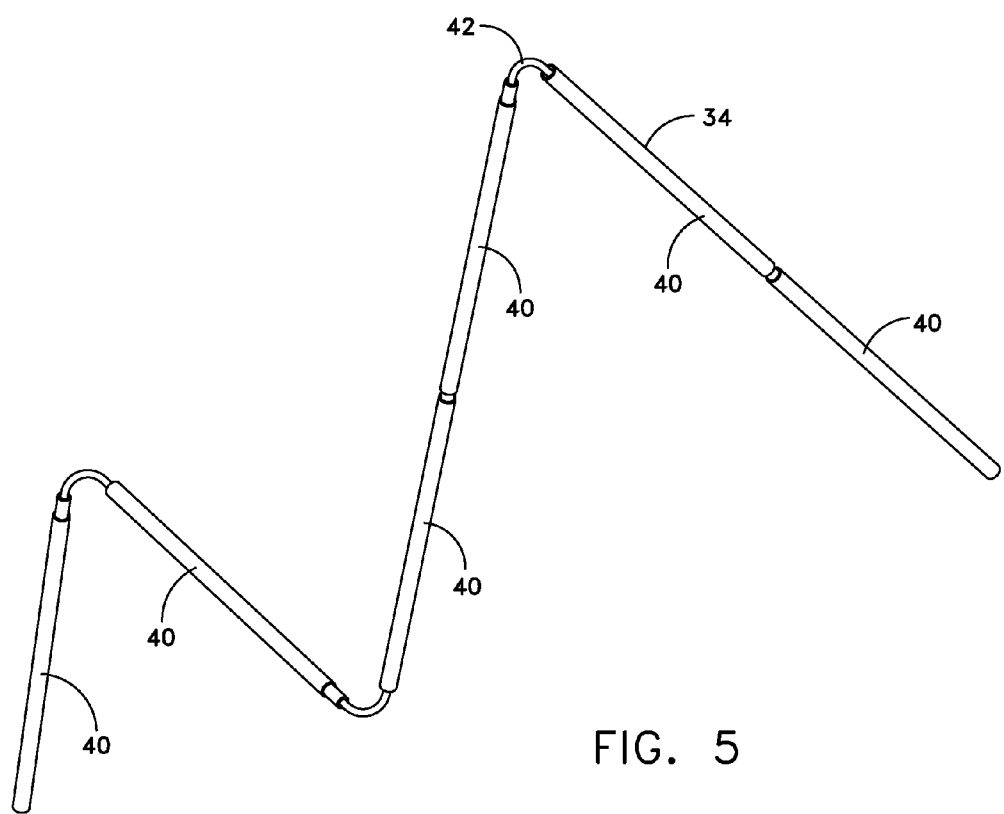
FIG. 5 is a view showing a shock cord pole of the air containment panel assembly.

With reference to FIG. 5, the exemplary shock cord pole 34 is shown. In one embodiment, the shock cord pole 34 includes a plurality of hollow rod segments, each indicated at 40, which are interconnected by an elastic cord 42. The hollow rod segments 40 may be releasably secured to one another in the traditional manner by having an end of one hollow road segment being configured to be received by an end of the adjacent hollow rod segment. As stated above, the construction of the shock cord poles is well known in the art.

Figure 6:
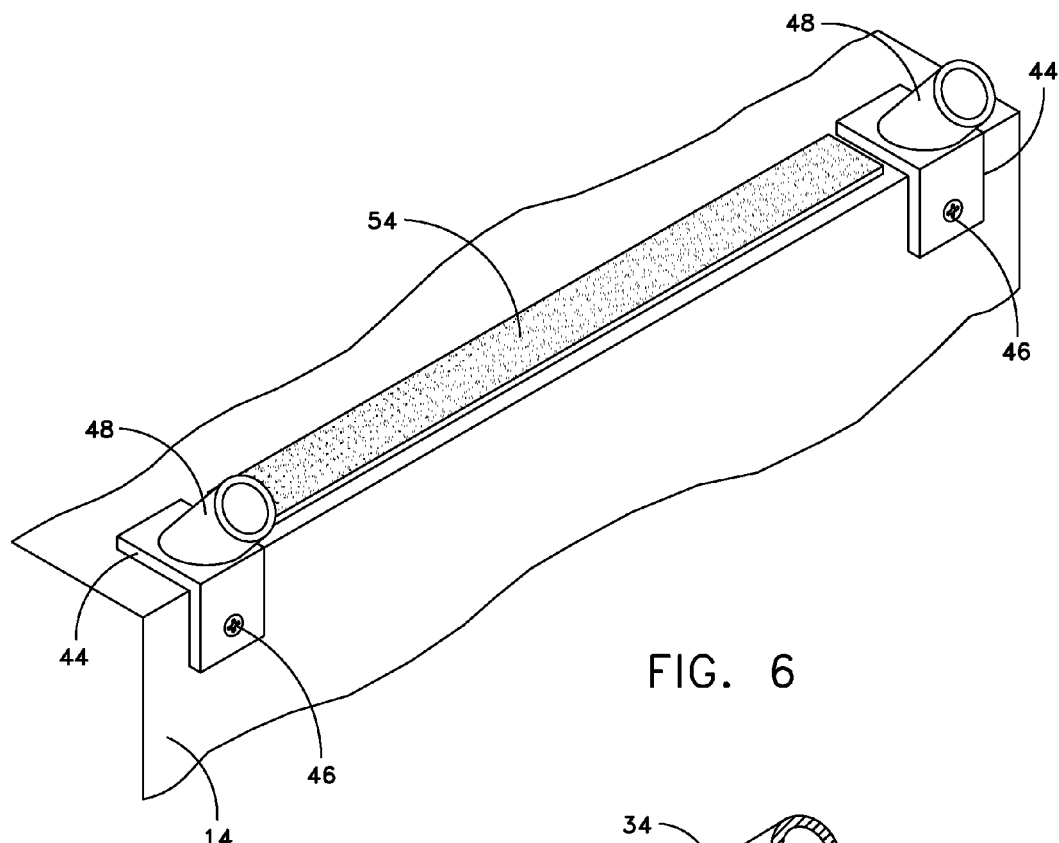
FIG. 6 is a perspective view of connectors of the air containment panel assembly.
Figure 7:
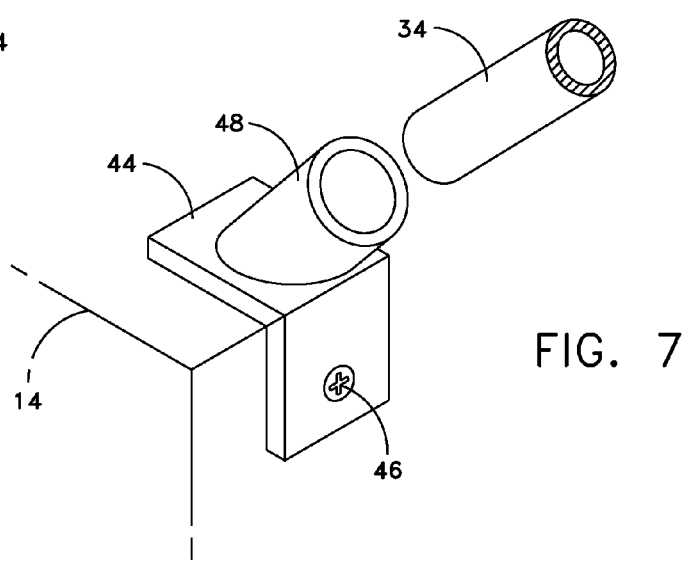
FIG. 7 is an enlarged perspective view of the shock cord pole prior to its insertion into a connector.
Figure 8:
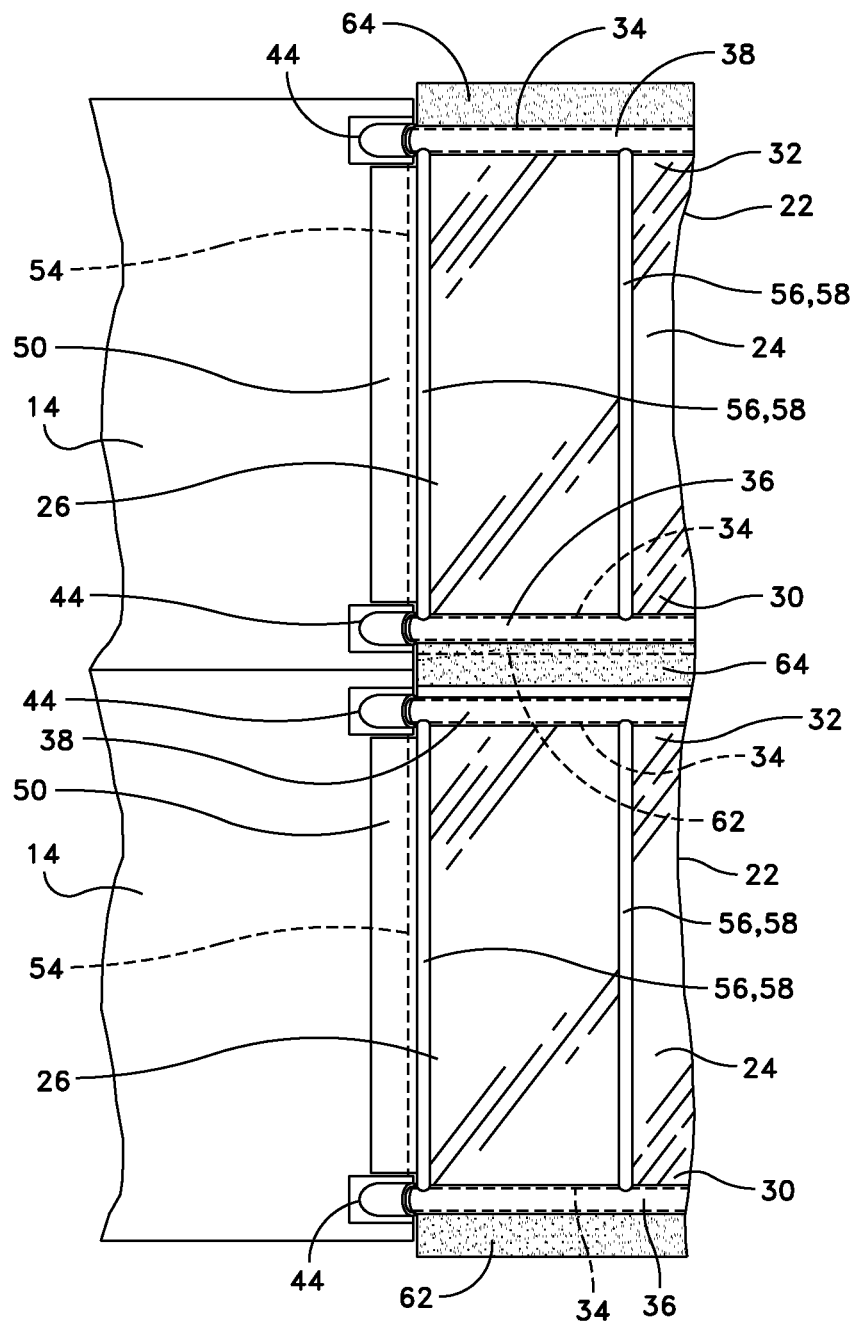
FIG. 8 is a top plan view of two air containment panel assemblies installed on two equipment racks.

Referring to FIGS. 6-8, in one embodiment, the flexible panel 24 is secured to the equipment racks 14 by a plurality of brackets or connectors, each indicated at 44, which are suitably secured to the equipment racks. The brackets 44 may be secured to their respective equipment racks 14 by any suitable manner, such as screw fasteners 46 or welds. Specifically, each end of the shock cord pole 34 is received in a bracket 44 designed with an annular portion 48 designed to capture the end of the pole. Thus, to secure the panel assembly 22, the ends of the two shock cord poles 34 are inserted into respective annular portions 48 of the brackets 44, which in turn are secured to the equipment racks 44. It should be understood that the panel assemblies 22 may be secured to other objects, such as walls. Once inserted into the brackets 44, the shock cord poles 34 may be flexed so that the opposite ends of the shock cord poles may be inserted into respective brackets secured to the equipment racks 14 that are disposed on the other side of the hot aisle 12.

As shown in FIGS. 2 and 3, and particularly in FIG. 3, the ends 26, 28 of the flexible panel 24 may include flaps of material 50, 52, respectively. In a certain embodiment, the underside of each flap 50, 52 may include a strip of hook and loop fastener material (not shown) that is configured to be releasably secured to a mating strip of hook and loop fastener material 54 (FIG. 6) to enclose the ends 26, 28 of the flexible panel 24. The arrangement is such that the strip of hook and loop fastener material of the flap (e.g., hook fastener material) may releasably engage the strip of hook and loop fastener material 54 disposed on the equipment rack 14 (e.g., loop fastener material). When secured to their respective strips of hook and loop fastener material, the flaps 50, 52 assist in providing an airtight seal of the ends of the flexible panel 24 with their respective equipment racks 14. Other fastening devices, such as snaps, buttons and zippers, may be provided in place of the hook and loop fastener material.

Turning now to FIG. 9, to provide widthwise support, the panel assembly 22 may include one or more cross supports, each indicated at 56, which are designed to extend between the two shock cord poles 34. Each cross support 56 may be secured to the flexible panel 24 by way of a sleeve 58 formed in the flexible panel. However, it should be understood that the cross supports 56 may be secured to the flexible panel 24 in any suitable fashion to provide widthwise support to the flexible panel. For example, the ends of the cross supports may be configured to be secured to respective shock cord poles. In a certain configuration, each cross support 56 may include a plurality of light elements 60, such as light-emitting diodes ("LEDs"), which are appropriately connected to a power source (not shown). The light elements 60 provide additional illumination within the aisle 12 in the case where additional illumination is required.

As best shown in FIGS. 3 and 4, the panel assembly 22 may be further configured with side connectors for sealing the sides 30, 32 of the panel assembly with adjacent panel assemblies. In one embodiment, to seal a panel assembly 22 with an adjacent panel assembly, the sides 30, 32 of each flexible panel 24 include flap 62, 64, respectively. Each flap 62, 64 has hook and loop fastener material disposed on top and bottom surfaces 66, 68 of the flap. The arrangement is such that when placing the panel assemblies 22 in close, side-by-side relation, the flaps 62, 64 of adjacent flexible panels may be releasably connected by engaging the hook and loop fastener material provided on a side of one of the flaps (e.g., hook fastener material on surface 66) with hook and loop fastener material provided on a side of an adjacent flap (e.g., loop fastener material on surface 68). Other types of fasteners may be employed in place of hook and loop fastener material. For example, snap fasteners, buttons and zippers, and the like may be employed.

Thus, when creating a ceiling between the equipment racks 14, for example, the panel assemblies 22 may be connected to the equipment racks and with one another to create an airtight seal along the length of the aisle 12. The end flaps 50, 52 of the panel assemblies 22 may be secured to their respective equipment racks 14. Similarly, the side flaps 62, 64 of the panel assemblies 22 may be secured to side flaps of adjacent panel assemblies or a wall when a row of equipment racks are positioned next to a wall. The arrangement is such that the panel assemblies 22 provide a lightweight, airtight cover to the aisle 12, and a scalable system to accommodate any length.

Turning now to FIGS. 10-14, and more particularly to FIGS. 10 and 11, another embodiment of a panel assembly 100 of the air containment system 20 is disclosed. As with panel assembly 22, panel assembly 100 shown in FIGS. 10 and 11 may be configured to be connected to adjacently placed panel assemblies (either 22 or 100). Each panel assembly 100 has a flexible panel 102 that may be fabricated from a suitable translucent material, such as fabric or plastic. The translucent material enables light to pass through the flexible panel 102 for illuminating the aisle 12 when employing the air containment system 20 The flexible panel 102 may be generally rectangular in shape, having opposite ends 104, 106 and opposite sides 108, 110.

As best shown in FIGS. 10 and 11, the panel assembly 100 includes a support housing 112 configured to be secured to the equipment rack 14. As shown, the support housing 112 is a generally box-like structure that is suitably secured, e.g., by fasteners or welds, to the equipment rack 14. The support housing 112 may include a spring-loaded reel 114 that is connected to one end 104 of the flexible panel 102. FIG. 10 illustrates the flexible panel 102 in a substantially retracted position. FIG. 11 illustrates the flexible panel 102 in an extended position. The arrangement is such that when in its extended position, the flexible panel 102 of the panel assembly 100 extends over the aisle 12 between the equipment racks 14. In one embodiment, the flexible panel 102 may be supported to achieve a generally arcuate in shape to enable a person to comfortably walk through the aisle 12 when the air containment system 20 is deployed. For example, to provide lengthwise support, the panel assembly 100 may include two shock cord poles (not shown) that are received in respective sleeves (not shown) formed in the flexible panel 102 provided along the sides 108, 110 of the flexible panel. The ends of the shock cord poles may be received in pockets formed in the flexible panel. To provide widthwise support, the panel assembly 102 may include one or more cross supports (not shown) that is designed to extend between the two shock cord poles.

The panel assembly 100 may be further configured with end and side connectors for sealing the free end 106 of the panel assembly with its respective equipment rack 14 and sides 108, 110 of the panel assembly with adjacent panel assemblies. For example, the free end 106 of the flexible panel 102 may include a flap 114 having a strip of hook and loop fastener material that is configured to releasably attach to a mating strip of hook and loop fastener material provided on the equipment rack 14.

With reference to FIG. 12, a flexible, elongated connector 116 may be provided to secure the sides 108, 110 of the flexible panels 102 to one another. In one embodiment, the connector 116 may be fabricated from polymeric material.

Figure 13:
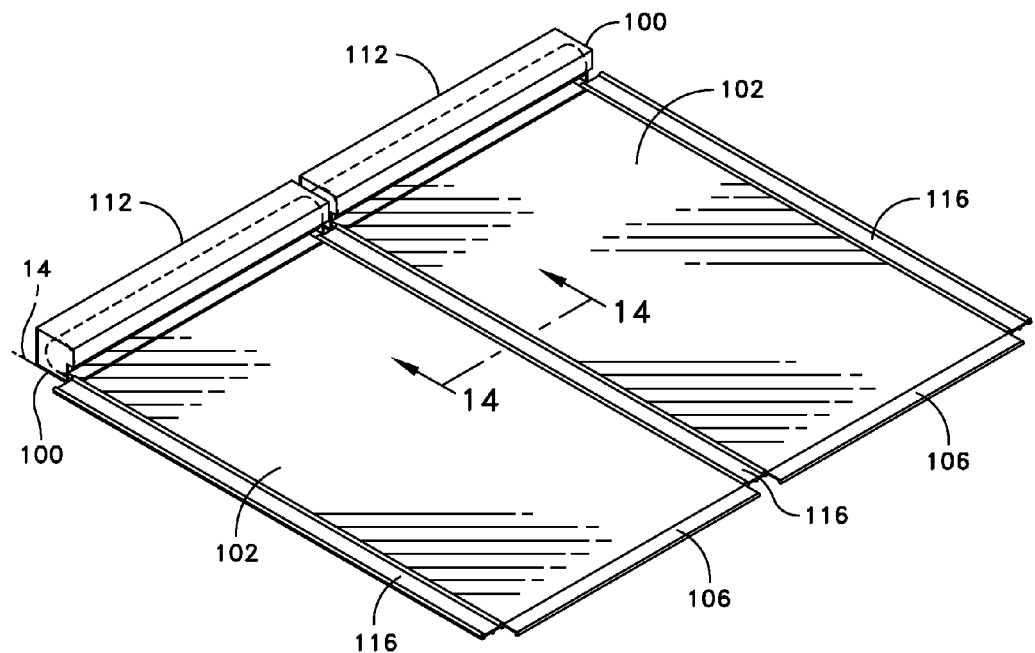
FIG. 13 is a perspective view of two air containment panel assemblies with the flexible panels in an extended position.
Figure 14:
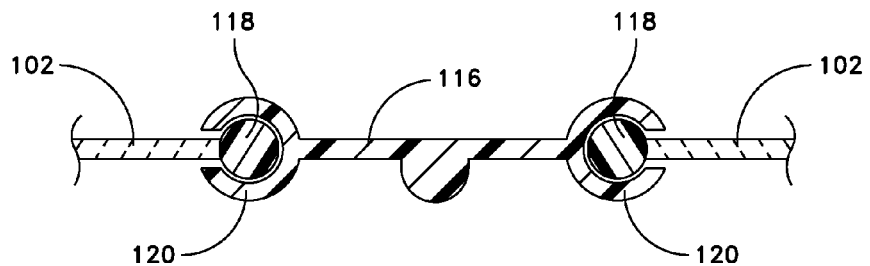
FIG. 14 is a cross-sectional view taken along line 14-14 in FIG. 13.

The side (e.g., side 108 as shown in FIG. 11) of the flexible panel 102 may be provided with a flexible member 118 (e.g., in the shape of a bulbous head) that is received within a mating member 120 formed in the connector 116 (e.g., a C-shaped member). The arrangement is such that when securing two panel assemblies 100 to one another, as shown in FIGS. 13 and 14, a substantially airtight seal between the panels 102 may be achieved.

A method of enclosing a hot or cold aisle of data center having a plurality of equipment racks arranged in rows within the data center is further disclosed. In one embodiment, when it is desirable to enclose a hot aisle, for example, the method may include: (a) securing a first end of a flexible panel to one of an equipment rack and a wall; (b) securing a second end of a flexible panel to one of an equipment rack and a wall, the flexible panel extending across the hot or cold aisle; and (c) securing at least one side of the flexible panel to a side of an adjacent flexible panel. When securing the first end of the flexible panel, when employing panel assembly 22, the connectors are secured to the equipment rack or the wall provided on one side of the aisle, and the ends of the shock cord poles are inserted into the connectors. Similarly, when securing the second end of the flexible panel, the connectors are secured to the equipment rack or the wall provided on the other side of the aisle, and the opposite ends of the shock cord poles are inserted into the connectors.

When employing panel assembly 100, the support housing is secured to either the equipment rack or the wall provided on one side of the aisle, and the flexible panel is extended from the supply roll of the support housing to the equipment rack or the wall provided on the other side of the aisle. The end of the flexible panel is secured, by means of hook and loop fastener material, for example, to the equipment rack or the wall. In a certain embodiment, to create the arcuate shape when employing panel assembly 100, shock cord poles may be provided in sleeves formed in the flexible panel. The ends of the shock cord poles may be received in pockets formed in the flexible panel.

To secure the sides of the panel assembly, with panel assembly 22, the hook and loop fastener material provided on the flaps of material are engaged with one another to create a substantially airtight seal. With panel assembly 100, the connector may be used to attach the sides of adjacent flexible panels. Similarly, the ends of the flexible panel may be secured to their respective equipment racks or walls by engaging the hook and loop fastener material of the flaps with mating strips of hook and loop fastener material provided on the equipment racks or walls.

It should be understood that although the panel assembly is configured to be secured to two equipment racks, the panel assembly may be secured to other objects, such as a wall or a knee wall. For example, a row of equipment racks may be spaced from a wall, wherein one of the ends of the panel assembly is secured to the wall. With this configuration, when employing panel assembly 22, the brackets may be secured to the wall. Similarly, when employing panel assembly 100, the support housing may be secured to the wall. Suitable fasteners may be provided to secure the brackets and the support housing to the wall. In other configurations, the air containment system may be used to provide overhead containment within a cold aisle.

Thus, it should be observed that the systems and methods of containing air within a data center as disclosed herein are particularly effective in controlling the flow of air. The systems and methods disclosed herein reduce the cost and installation time as compared to prior art systems. The systems and methods further are adapted to be installed in existing data centers without extraordinary customization. In this regard, the systems and methods are particularly suited for accommodating any aisle width or rack height. Moreover, embodiments of the hot aisle air containment system may be secured or otherwise attached to any regular or irregular surface, and are not restricted to only attach to a rack or flat wall.

In certain embodiments, the collapsible frame and flexible panel enable quick and easy installation, while providing a substantially airtight seal. When incorporating the extendable spring-loaded supply roll configuration, the flexible panel may be easily extended to the use position, and returned to a stored position when it is desirable to remove the ceiling. The translucent flexible material enables light to pass through the flexible panel so as to enable operators of the data center to see when working within the aisle. If improved lighting is required, the LEDs may be provided on the cross members to provide additional illumination.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. First and second panel assemblies for an air containment system configured to enclose a hot or cold aisle of a data center defined by a first row of first and third equipment racks provided on one side of the aisle and a second row of second and fourth equipment racks provided on an opposite side of the aisle, the first and second panel assemblies each comprising:
   a lightweight, flexible panel fabricated from fabric or plastic, the lightweight flexible panel having a first end, a second opposite end, a first side and a second opposite side, the flexible panel having a widthwise dimension approximately equal to a widthwise dimension of one of the equipment racks,
   a support housing configured to be secured to one of the first or third equipment racks provided on the one side of the aisle, the support housing comprising a spring-loaded supply roll configured to secure the first end of the flexible panel,
   an end connector configured to secure the second end of the flexible panel to one of the second or fourth equipment racks provided on the opposite side of the aisle,
   wherein the flexible panel is configured to be removed from the spring-loaded supply roll to extend to one of the second or fourth equipment racks provided on the opposite side of the aisle;
   wherein the support housing of the first panel assembly is secured to the first equipment rack provided on one side of the aisle, and the end connector provided on the second end of the flexible panel of the first panel assembly is secured to the second equipment rack provided on the opposite side of the aisle,
   wherein the support housing of the second panel assembly is secured to the third equipment rack provided on the one side of the aisle immediately adjacent to the first equipment rack, and the end connector provided on the second end of the flexible panel of the second panel assembly is secured to the fourth equipment rack provided on the opposite side of the aisle immediately adjacent to the second equipment rack, and
   wherein the second side of the flexible panel of the first panel assembly is immediately adjacent to the first side of the flexible panel of the second panel assembly to create a substantially contiguous ceiling over a space within the aisle defined between the first and third equipment racks and the second and fourth equipment racks, and
   at least one side connector configured to secure the second side of the flexible panel of the first panel assembly to the first side of the flexible panel of the second panel assembly, the at least one side connector including a flexible member secured to one of the second side of the flexible panel of the first panel assembly or to the first side of the flexible panel of the second panel assembly and a mating member coupled to the other of the second side of the flexible panel of the first panel assembly or the first side of the flexible panel of the second panel assembly, the flexible member being received within the mating member to create a substantially airtight seal between the flexible panels of the first and second panel assemblies.

2. The first and second panel assembly of claim 1, wherein each second end connector comprises one of a hook and loop fastener material configured to releasably engage the other of the hook and loop fastener material hook and loop fastener material provided on each of the second and fourth equipment racks provided on the opposite side of the aisle.

3. The first and second panel assembly of claim 1, wherein each flexible panel of the first and second panel assemblies may be extended from each of the support housings to a desired length.

4. A method of enclosing a hot or cold aisle of a data center having a first row of first and third equipment racks provided on one side of the aisle and a second row of second and fourth equipment racks provided on an opposite side of the aisle, the method comprising:
   providing first and second panel assemblies each comprising:
      a lightweight, flexible panel fabricated from fabric or plastic, the lightweight flexible panel having a first end, a second opposite end, a first side and a second opposite side, the flexible panel having a widthwise dimension approximately equal to a widthwise dimension of one of the first through fourth equipment racks,
      a support housing configured to be secured to one of the first or third equipment racks provided on one side of the aisle, the support housing comprising a spring-loaded supply roll configured to secure the first end of the respective flexible panel,
      an end connector configured to secure the second end of the respective flexible panel to one of the second or fourth equipment racks provided on an opposite side of the aisle,
      each respective flexible panel being configured to be removed from the spring-loaded supply roll to extend to one of the second or fourth racks provided on the opposite side of the aisle;
   securing the support housing of the first panel assembly having the respective flexible panel to the first equipment rack provided on the one side of the aisle;
   securing the second end of the respective flexible panel of the first panel assembly to the second equipment rack provided on the opposite side of the aisle with the first end connector provided on the second end of the respective flexible panel;
   securing the support housing of the second panel assembly having the respective flexible panel to the third equipment rack provided on the one side of the aisle immediately adjacent to the first equipment rack;

securing the second end of the respective flexible panel of the second panel assembly to the fourth equipment rack provided on the opposite side of the aisle immediately adjacent to the second equipment rack; and securing the second side of the respective flexible panel of the first panel assembly immediately adjacent to the first side of the respective flexible panel of the second panel assembly to create a substantially contiguous ceiling over a space within the aisle defined between the first and third equipment racks and the second and fourth equipment racks with at least one side connector configured to secure the second side of the respective flexible panel of the first panel assembly to the first side of the respective flexible panel of the second panel assembly, the at least one side connector including a flexible member secured to one of the second side of the respective flexible panel of the first panel assembly or to the first side of the respective flexible panel of the second panel assembly and a mating member coupled to the other of the second side of the respective flexible panel of the first panel assembly or the first side of the respective flexible panel of the second panel assembly, the respective flexible member being received within the mating member to create a substantially airtight seal between the respective flexible panels of the first and second panel assemblies.

\* \* \* \* \*